(12) United States Patent
Chung et al.

(10) Patent No.: US 6,977,136 B2
(45) Date of Patent: Dec. 20, 2005

(54) METHOD FOR MANUFACTURING AN ORGANIC ELECTROLUMINESCENT DISPLAY

(75) Inventors: Chia-Tin Chung, Miao Li (TW);
Su-Jen Chang, Bing Dong (TW);
Andrea Hwang, Zhang Hwa (TW);
Chen-Ze Hu, Zhong Ho (TW)

(73) Assignee: Chi Mei Optoelectronics Corporation, (JP)

( * ) Notice: Subject to any disclaimer, the term of this patent is extended or adjusted under 35 U.S.C. 154(b) by 46 days.

(21) Appl. No.: 09/730,904

(22) Filed: Dec. 5, 2000

(65) Prior Publication Data

US 2002/0090579 A1 Jul. 11, 2002

(30) Foreign Application Priority Data

Nov. 23, 2000 (TW) ................ 89124906 A (51) Int. Cl.$^7$ ................................ H01J 9/227
(52) U.S. Cl. .............. 430/321; 430/314; 430/317; 430/319; 445/24
(58) Field of Search ............... 430/321, 319, 430/313, 314, 318, 317; 445/24; 313/504

(56) References Cited

U.S. PATENT DOCUMENTS 5,701,055 A * 12/1997 Nagayama et al. ......... 313/504
6,290,563 B1 * 9/2001 Codama et al. ............. 445/24
6,351,066 B1 * 2/2002 Gyoutoku et al. .......... 313/504

FOREIGN PATENT DOCUMENTS

JP 11-317288 A * 11/1999

* cited by examiner

Primary Examiner—John A. McPherson
(74) Attorney, Agent, or Firm—Baker & McKenzie

(57) ABSTRACT

A method for manufacturing an organic electroluminescent display is disclosed; the method utilizes only one photo mask to produce the cathode ramparts and insulating layer so as to simply the manufacturing procedure, reduce the time and the cost required for manufacture and reduce the inaccuracy of alignment. The manufacturing method according to the present invention firstly forms a plurality of first display electrodes arranged in parallel on a substantially transparent substrate, and forms a non-photosensitive and a photosensitive insulating layer thereon. After proceeding a photolithography process, developing processes, the cathode ramparts and the insulating layer are formed simultaneously and the first display electrodes are exposed partially. An organic electroluminescent material is then formed on the exposed first display electrodes and a plurality of second display electrodes are formed on the organic electroluminescent material to complete an organic electroluminescent display.

32 Claims, 6 Drawing Sheets

METHOD FOR MANUFACTURING AN ORGANIC ELECTROLUMINESCENT DISPLAY

BACKGROUND OF THE INVENTION

1. Field of the Invention

The present invention relates generally to a method for making organic electroluminescent displays, and more particularly to a method for making cathode ramparts and insulating layer of an organic electroluminescent display through only one photo mask.

2. Description of the Related Art

With the advent of the information technology age, there is an increasing demand for high-quality electro-optical displays, in which liquid crystal displays (LCD) are the most popular. A LCD backlight module comprising a light guide and a reflective plate is utilized for introducing the light beams, emitted from the cold cathode fluorescent lamp, vertically to the liquid crystal display panel, in which the liquid crystal contained therein controls the illuminance of the LCD. Conventional LCDs have a limited view angle and require very complicated manufacturing processes, which result in high manufacturing costs and relatively low yields. However, organic electroluminescent displays (OELD) have larger view angles and can be produced through less complex manufacturing process. These advantages are based on the self-luminance of the organic elements in the organic electroluminescent displays, which results in the unrestricted view visual, more natural colors displayed, increased operational temperature range and shorter response time.

Figure 1:
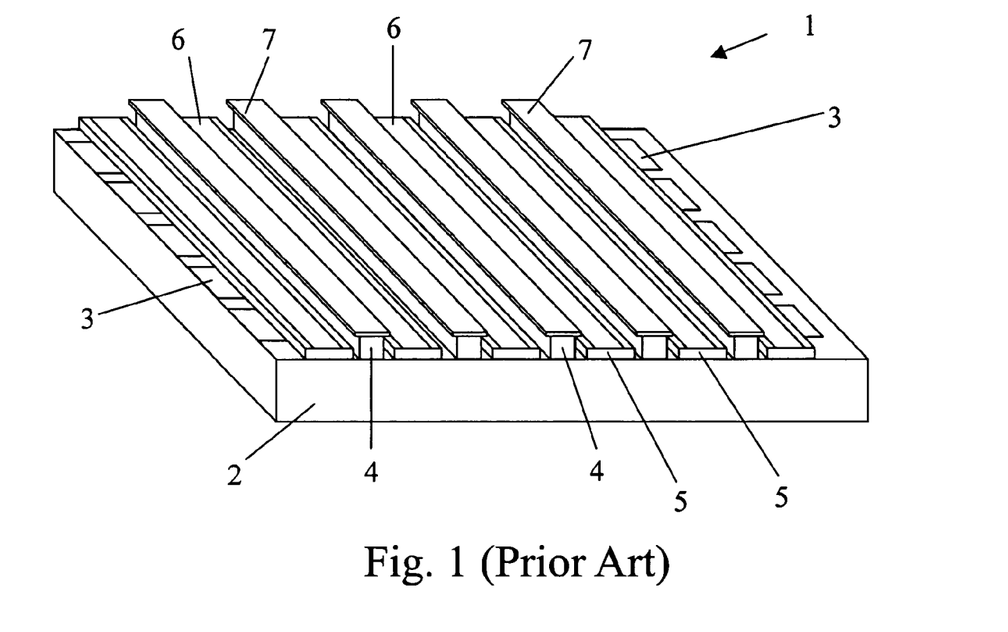
FIG. 1 is a perspective view illustrating a structure of a conventional organic electroluminescent display.

With reference to FIG. 1, the structure of a conventional organic electroluminescent display 1 is shown. A glass substrate 2 carries a plurality of first display electrodes 3 arranged in parallel and a plurality of cathode ramparts 4 made of an electrical insulation material are formed on the substrate 2. The cathode ramparts 4 are arranged perpendicular to the first display electrodes 3 and apart from each other, and are protruded from the substrate and exposes at least portions of the first display electrodes 3. Each cathode rampart 4 at the upper part thereof has an overhang portion 7 protruded in a direction parallel to the substrate 2. Between the cathode ramparts 4, organic electroluminescent layers 5 are formed on the exposed first display electrodes 3, and a plurality of second display electrodes 6 are formed on the organic electroluminescent layers 5.

Figure 2A:
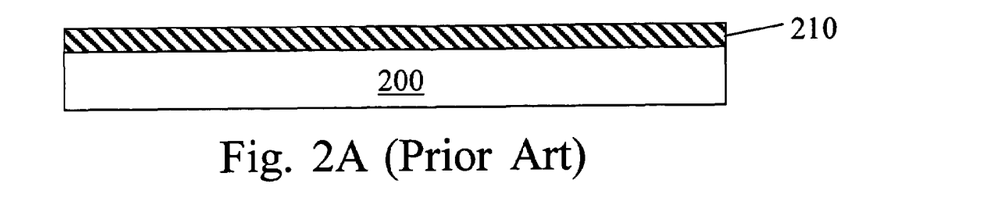
FIGS. 2A–2F are schematic views illustrating the conventional manufacturing processes of an organic electroluminescent display utilizing two shadow masks for forming cathode ramparts.
Figure 2B:
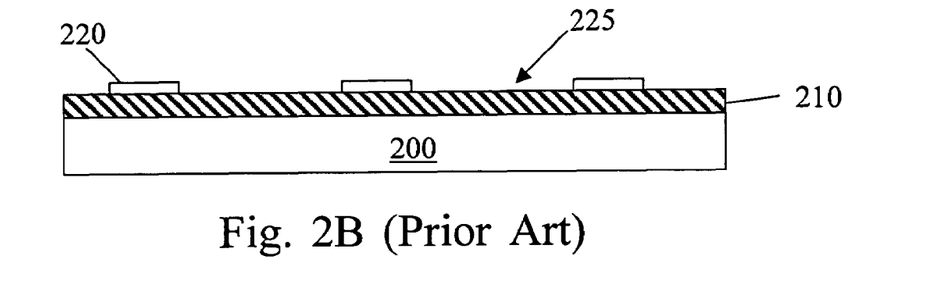
Figure 2C:
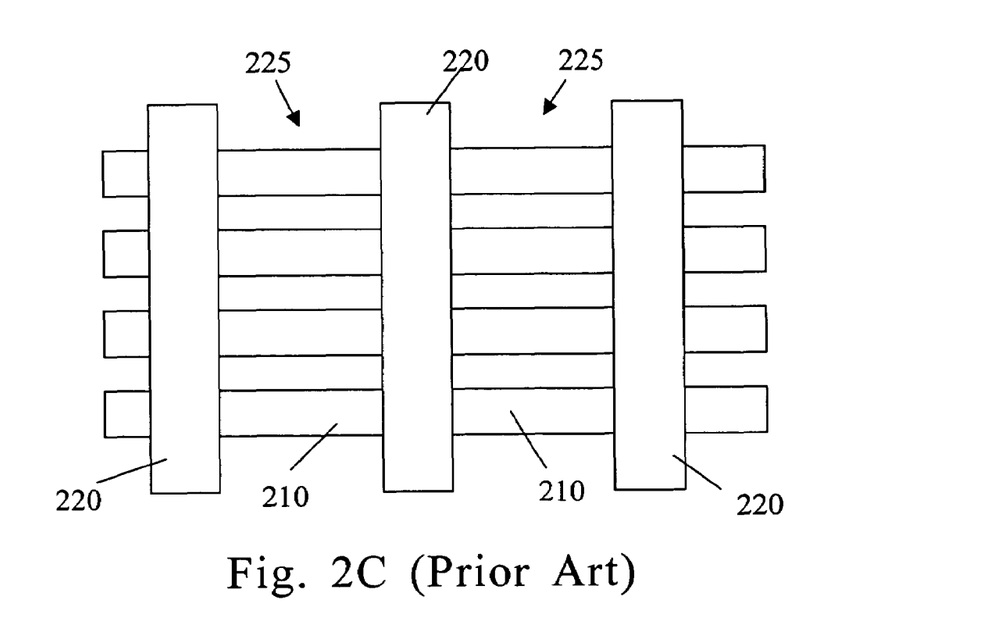
Figure 2D:
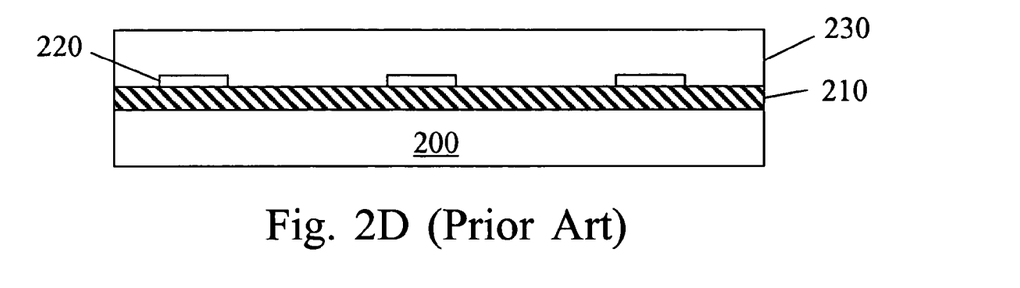
Figure 2E:
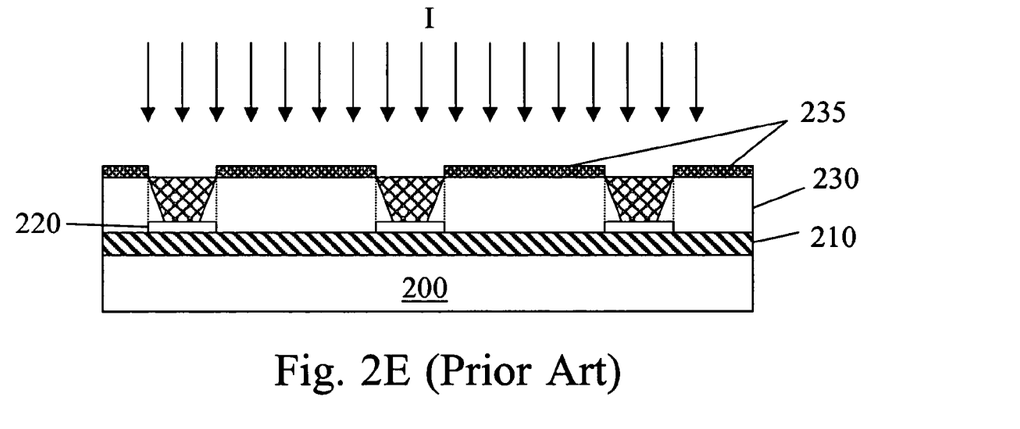
Figure 2F:
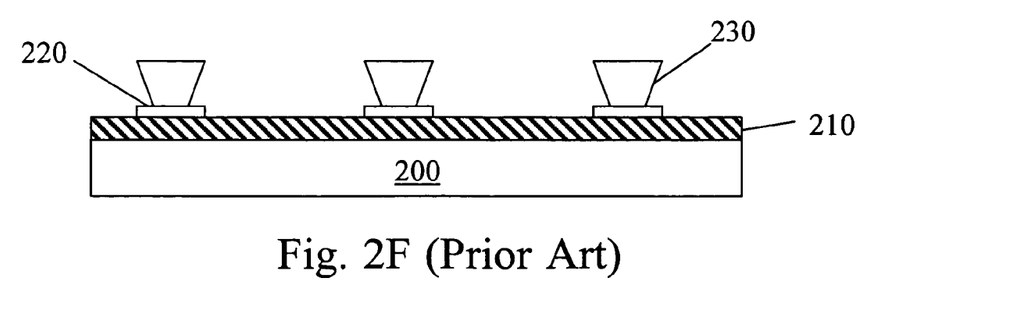

With reference to FIG. 2A-2F, a conventional manufacturing process of an organic electroluminescent display is shown. A plurality of first display electrodes 210 of stripe shapes arranged in parallel are formed on a glass substrate 200 by a sputtering process, as shown in FIG. 2A. A layer of insulating material 220 is spin-coated on the substrate 200 with the first display electrodes 210 disposed thereon. Then, shadow masks are disposed on the insulating material 220, and after a photolithography process, openings 225 having a direction perpendicular to that of the first display electrodes 210 are formed, thereby exposing the first display electrodes 210 partially, as shown in the top view of FIG. 2B and the sectional view of FIG. 2C. Next, as shown in FIG. 2D, a layer of photoresistant material 230 is formed on the insulating material 220 having openings 225. With reference to FIG. 2E, photo masks 235 are formed on the photoresistant material 230 and are illuminated by parallel light beams I. Due to the mask effect of the photo masks 235, only the portions of the photoresistant material 230, i.e. the mesh areas, are illuminated by the light beams I. Subsequently, a developing process is conducted on the photoresistant material 230 so as to form a shape of cathode ramparts shown in FIG. 2F. Finally, an organic electroluminescent material is formed on the exposed first display electrodes and then a plurality of second display electrodes are formed on the organic electroluminescent material such that an organic electroluminescent display is completed.

In the prior manufacturing processes of an organic electroluminescent display, two photo masks are required for the formation of the cathode ramparts; the first photo mask is utilized for forming openings in the insulating materials, and the second photo mask is utilized for forming cathode ramparts.

SUMMARY OF THE INVENTION

The principal object of the present invention is to provide a method for manufacturing an organic electroluminescent display, which simplifies the manufacturing procedure, reduces the time and the cost required for manufacture and reduces the inaccuracy of alignment.

To achieve this object, the present invention provides a method for manufacturing an organic electroluminescent display, comprising the steps of: forming a substantially transparent substrate; forming a plurality of first display electrodes arranged in parallel on said substrate; forming a non-photosensitive insulating layer on said substrate with first display electrodes disposed thereon; forming a photosensitive insulating layer on said non-photosensitive insulating layer; performing a photolithography process on said photosensitive insulating layer; developing said photosensitive insulating layer and etching said non-photosensitive insulating layer so as to form a plurality of photosensitive insulating layer and the non-photosensitive insulating layer having a shape with its longitudinal axis substantially perpendicular to the that of the first display electrodes, and the first display electrodes being exposed partly; forming an organic electroluminescent material on the exposed first display electrodes; and forming a plurality of second display electrodes on the organic electroluminescent material.

An alternative method for manufacturing an organic electroluminescent display according to the present invention comprises the steps of providing a substantially transparent substrate; forming a plurality of first display electrodes arranged in parallel on said substrate; forming a non-photosensitive insulating layer on said substrate with the first display electrodes disposed thereon; imidizing said non-photosensitive insulating layer by baking; forming a photosensitive insulating layer on said non-photosensitive insulating layer, and pre-baking said photosensitive insulating layer; proceeding a photolithography process on said photosensitive insulating layer so as to define a shape perpendicular to that of the first display electrodes, and proceeding a post-exposure baking thereon; disposing an aggregate composed of said substrate with said first display electrodes, said non-photosensitive insulating layer and said photosensitive insulating layer disposed thereon into developers, whereby said photosensitive insulating layer is partially removed through development and said non-photosensitive insulating layer is partially removed by etching, and thereby said first display electrodes are exposed partially; proceeding to a curing process on said aggregate; forming an organic electroluminescent material on the exposed first display electrodes; and forming a plurality of second display electrodes on the organic electroluminescent material.

The present invention further provides a method for manufacturing an organic electroluminescent display, comprising the steps of: forming a substantially transparent substrate; forming a plurality of first display electrodes arranged in parallel on said substrate; forming a first photosensitive insulating layer on said substrate with first display electrodes disposed thereon; forming a second photosensitive insulating layer on said first photosensitive insulating layer; performing a photolithography process on said first and second photosensitive insulating layers; developing said first and second photosensitive insulating layers simultaneously so as to form a plurality of first and second photosensitive insulating layers having a shape with its longitudinal axis substantially perpendicular to the that of the first display electrodes, and the first display electrodes being exposed partly; forming an organic electroluminescent material on the exposed first display electrodes; and forming a plurality of second display electrodes on the organic electroluminescent material, wherein the photosensitivity of the first photosensitive insulating layer is different from that of the second photosensitive insulating layer.

Still another method for manufacturing an organic electroluminescent display according to the present invention comprises the steps of providing a substantially transparent substrate; forming a plurality of first display electrodes arranged in parallel on said substrate; forming a first photosensitive insulating layer on said substrate with first display electrodes disposed thereon; forming a second photosensitive insulating layer on said first photosensitive insulating layer; proceeding a photolithography process to said first and second photosensitive insulating layers so as to define a shape perpendicular to that of the first display electrodes; disposing an aggregate composed of said substrate with said first display electrodes, said first photosensitive insulating layer and said second photosensitive insulating layer disposed thereon into developers, whereby said first and second photosensitive insulating layers are partially removed through development, and thereby said first display electrodes are exposed partially; forming an organic electroluminescent material on the exposed first display electrodes; and forming a plurality of second display electrodes on the organic electroluminescent material.

Additional advantages, objects and features of the present invention will become more apparent from the drawings and description which follows.

BRIEF DESCRIPTION OF THE DRAWINGS

The present invention will become more apparent from the detailed description given hereinbelow when read in conjunction with the accompanying drawings, which are given by means of illustration only and thus are not limitative of the present invention, in which.

| Brief Description of the Reference Numerals | |
|---|---|
| 1 | organic electroluminescent display |
| 2 | glass substrate |
| 3 | first display electrode |
| 4 | cathode rampart |
| 5 | organic electroluminescent layer |
| 6 | second display electrode |
| 7 | overhang portion |
| 200 | substrate |
| 210 | first display electrode |
| 220 | insulating materials |
| 225 | opening |
| 230 | photoresistant materials |
| 235 | photo mask |
| 300 | substrate |
| 310 | first display electrode |
| 320 | non-photosensitive insulating materials |
| 330 | photosensitive insulating materials |
| 335 | photo mask |
| 340 | organic electroluminescent materials |
| 350 | metal conductive materials |
| 400 | substrate |
| 410 | first display electrode |
| 420 | first photosensitive materials |
| 430 | second photosensitive materials |
| 435 | shadow mask |
| 440 | organic electroluminescent materials |
| 450 | metal conductive materials |

DETAILED DESCRIPTION OF THE PREFERRED EMBODIMENT

With reference to FIGS. 3A–3E, the method for manufacturing an organic electroluminescent display according to one embodiment of the present invention is shown. First with reference to FIG. 3A, a layer of substantially transparent conductive materials, such as indium tin oxide (ITO) or $In_2O_3$—ZnO, is formed on a substrate 300, such as a transparent glass substrate or a flexible, light-transmitting plastic substrate, by a sputtering process. Next, photoresists are provided on the conductive material as shadow masks such that a plurality of first display electrodes 310 of stripe shapes arranged in parallel are formed from the conductive materials as anode electrodes of the organic electroluminescent displays after a photolithography process for removing the portions of the conductive materials unmasked by the photoresists.

Figure 3A:
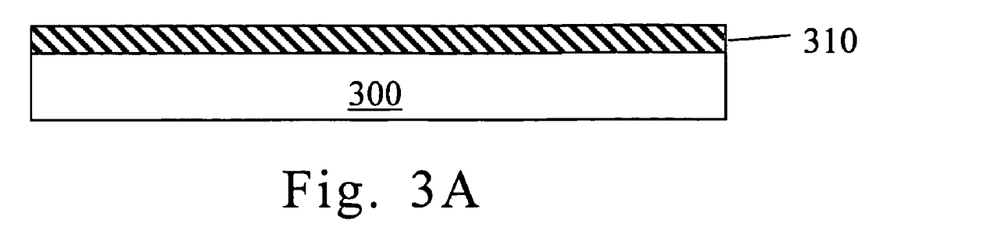
FIGS. 3A–3E are schematic views illustrating the manufacturing processes of an organic electroluminescent display according to one embodiment of the present invention.
Figure 3B:
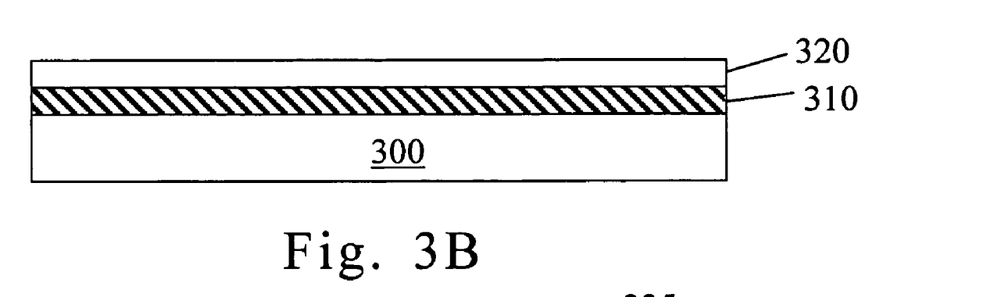

With reference to FIG. 3B, a blanket of non-photosensitive insulating material 320, preferably made of thermal type polyimide, is spin-coated on the substrate 300 with the first display electrodes 310 disposed thereon about 0.5–2 μm thickness for covering both the first display electrodes 310 and the substrate 300 exposed. Then, a first baking process is conducted on the non-photosensitive insulating material 320 to remove the presence of solvent therein, and a second baking process is subsequently conducted at a temperature between 120–180 Celsius degrees for 20 minutes to 1 hour to imidize the non-photosensitive insulating material 320, and thereby create partial cross-linking thereof.

Figure 3C:
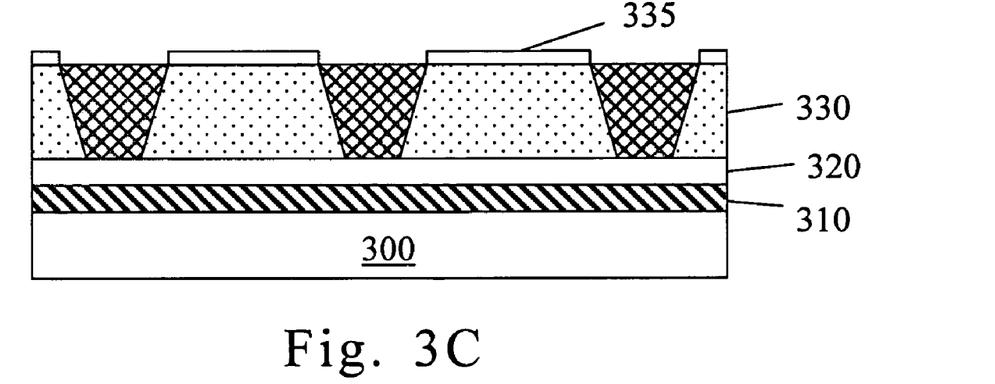

With reference to FIG. 3C, a blanket of photosensitive insulating material 330 is spin-coated on the non-photosensitive insulating material 320 with a thickness of about 3–5 μm as negative photoresists. Then, a pre-baking process is conducted to the photosensitive insulating material 330 to remove the solvent existed therein. Subsequently, photo masks 335 are disposed on the photosensitive insulating material 330, and after a photolithography process, a shape perpendicular to the first display electrodes 310 is defined in the photosensitive insulating material 330, wherein the exposure is proceeded at 30–80 mJ/cm$^2$. As shown in FIG. 3C, the portions of the photosensitive insulating materials material 330 illuminated during exposure process is represented as mesh areas. Then, a post-exposure baking process is conducted at a temperature between 90–150 Celsius degrees for 30–120 seconds to remove the solvent in the photosensitive insulating material 330.

Figure 3D:
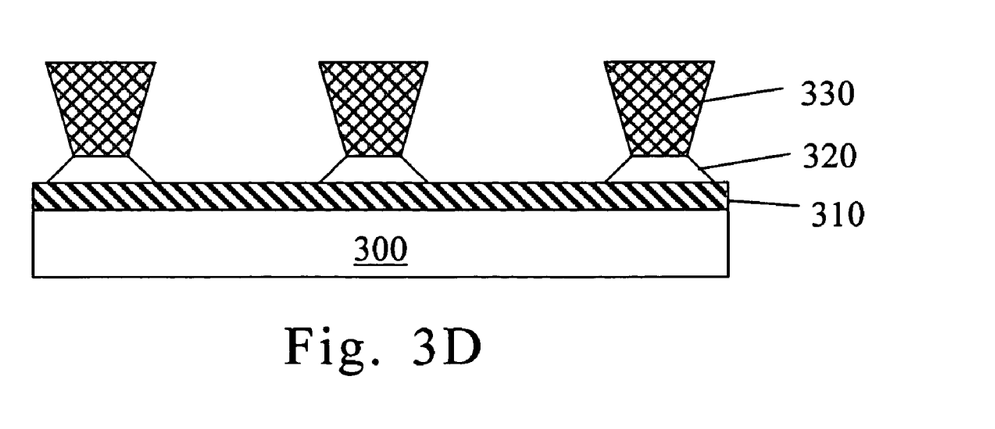

The whole aggregate is then disposed into or sprayed with developers, such as TMAH 2.38%, at room temperature for 50–100 seconds, such that the photosensitive insulating material 330 is partially removed through developing effect. After that, the non-photosensitive insulating material 320 is partially removed through wet-etching by the developers due to the partial cross-linking effect imparted during baking of the non-photosensitive insulating material 320. Since the adhesion between the non-photosensitive insulating material 320 and the photosensitive insulating material 330 is weaker, the photosensitive insulating material 330 is developed to be of a reversed trapezoid shape and the non-photosensitive insulating material 320 is etched to be of a trapezoid shape as shown in FIG. 3D. It should be noted that the long base of the reversed trapezoid shape of the photosensitive insulating material 330 is shorter than that of the trapezoid shape of the non-photosensitive insulating material 320, such that short circuit between the second display electrodes, which will be formed in the subsequent process, and the first display electrodes is avoided. Then, a curing process is conducted at a temperature between 200–350 Celsius degrees for 30 minutes to 2 hours, and thereby completing the formation of the cathode ramparts.

Figures 3E, 4A:
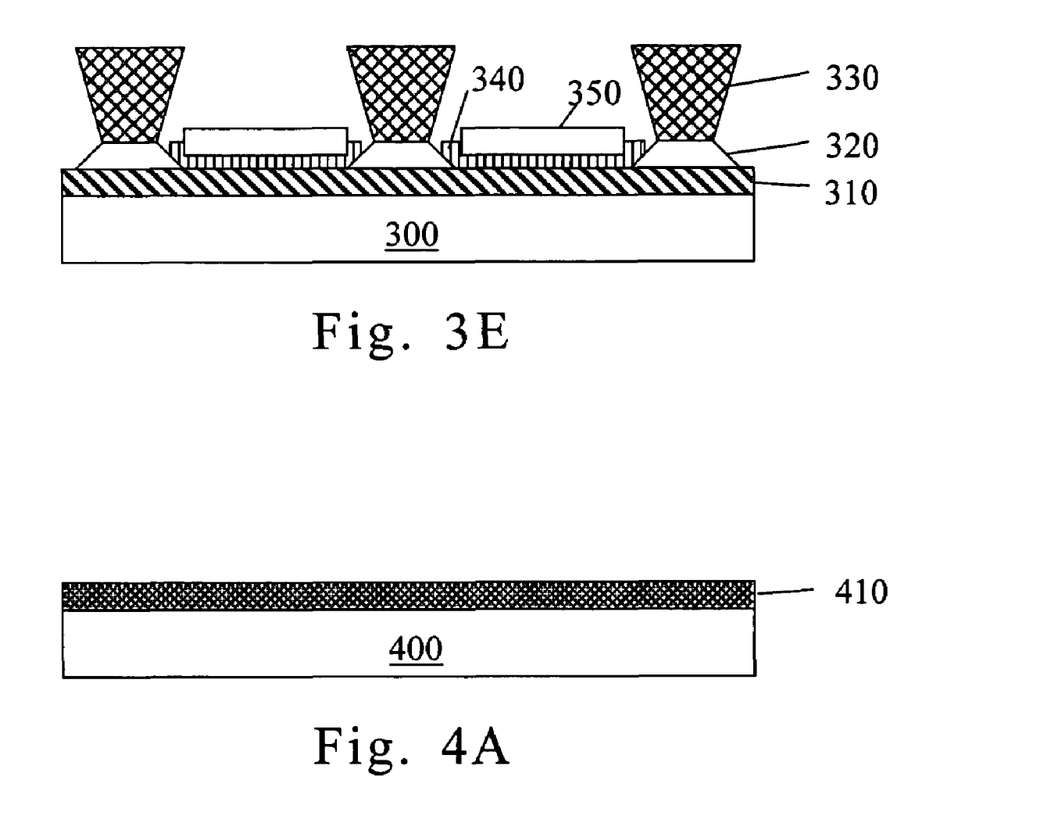
FIGS. 4A–4D are schematic views illustrating the manufacturing processes of an organic electroluminescent display according to another embodiment of the present invention.

Next, organic electroluminescent material 340 is formed on the exposed first display electrodes 310, as shown in FIG. 3E. While producing single-color organic electroluminescent displays, an organic electroluminescent layer is coated through evaporation on the exposed first display electrodes 310. While producing full-color organic electroluminescent displays, RGB organic electroluminescent layers are formed in turn on the exposed first display electrodes 310 by using shadow masks. Subsequently, metal conductive materials 350, such as Al, Mg—Al alloy or other suitable metal materials, are formed on the organic electroluminescent materials 340 as cathode electrodes of the organic electroluminescent displays.

Figure 4B:
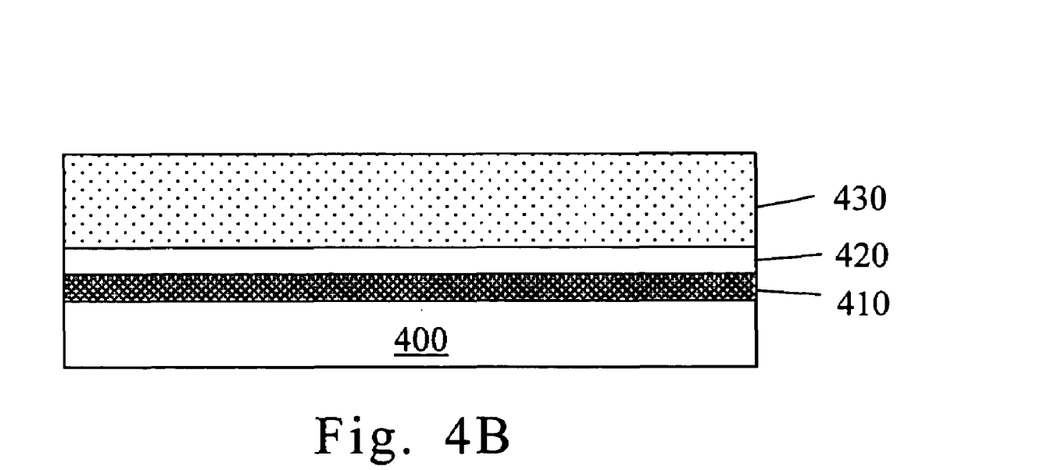

FIG. 4A-4D are the schematic drawings illustrating the manufacturing processes of an organic electroluminescent display according to another embodiment of the present invention. In this case, a plurality of first display electrodes 410 made of, for example, ITO or In$_2$O$_3$—ZnO as anode electrodes of the organic electroluminescent display of stripe shape arranged in parallel are formed on a substrate 400. Then, first photosensitive insulating material 420 and second photosensitive insulating material 430 are in turn formed on the substrate 400 with first display electrodes 410 disposed thereon as negative photoresists, for example, as shown in FIG. 4B. It should be noted that the photosensitivity of the first photosensitive insulating material 420 is greater than that of the second photosensitive insulating material 430.

Figure 4C:
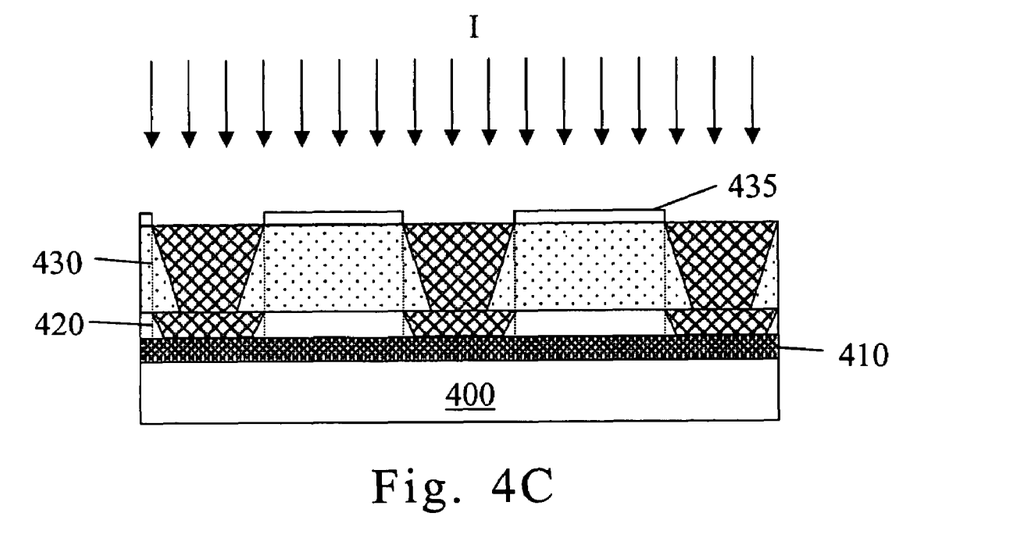
Figure 4D:
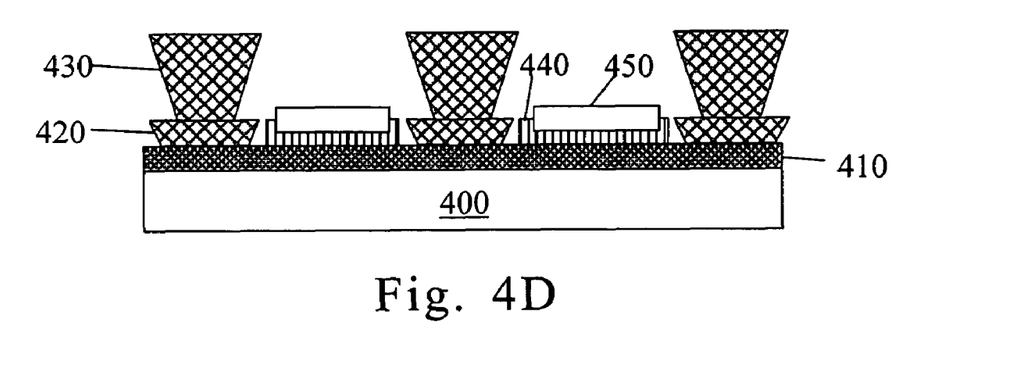

Next, photo masks 435 are disposed on the second photosensitive insulating material 430 and a photolithography process is conducted to the second photosensitive insulating material 430 and the first photosensitive insulating material 420 such that a shape perpendicular to the first display electrodes is defined therein. With reference to FIG. 4C, parallel light beams I incident to the second photosensitive insulating material 430 and the first photosensitive insulating material 420 are irradiated on the photo masks 435. Due to the masking effect of the photo masks 435, only the portions of the second photosensitive insulating material 430 and first photosensitive insulating material 420 marked by mesh areas are illuminated by the light beams I. Subsequently, a developing process is conducted on the second photosensitive insulating material 430 and the first photosensitive insulating material 420 and thereby forming cathode ramparts of shapes shown in FIG. 4D. Finally, organic electroluminescent material 440 is formed on the exposed first display electrodes 410, and metal conductive materials 450 are formed on the organic electroluminescent material 440 as cathode electrodes of the organic electroluminescent displays.

Although the preferred embodiments of the present invention have been disclosed for illustrative purposes, those skilled in the art will appreciate that various modifications, additions and substitutions are possible, without departing from the scope and spirit of the present invention as recited in the accompanying claims.

What is claimed is:

1. A method for manufacturing an organic electroluminescent display, comprising:
   forming a substantially transparent substrate;
   forming a plurality of first display electrodes arranged in parallel on said substrate;
   forming a non-photosensitive insulating layer over said substrate;
   applying a cross-linking process to said non-photosensitive insulating layer;
   forming a photosensitive insulating layer on said non-photosensitive insulating layer;
   performing a photolithography process on said photosensitive insulating layer;
   developing said photosensitive insulating layer and etching said non-photosensitive insulating layer so as to form a pattern of photosensitive insulating layer and non-photosensitive insulating layer having a shape with a longitudinal axis substantially perpendicular to a longitudinal axis of the first display electrodes, and the first display electrodes being exposed partly;
   forming an organic electroluminescent material on the exposed first display electrodes; and
   forming a plurality of second display electrodes on the organic electroluminescent material.

2. The method according to claim 1, wherein the non-photosensitive insulating layer is made of a thermal type polyimide.

3. The method according to claim 1, wherein the thickness of the non-photosensitive insulating layer is in a range of 0.5–2 μm.

4. The method according to claim 1, wherein applying a cross-linking process to the non-photosensitive insulating layer comprises performing a baking process.

5. The method according to claim 4, wherein the temperature of the baking process is in a range of 120–180 Celsius degrees.

6. The method according to claim 4, wherein the duration time of the baking process is in a range of 20–60 minutes.

7. The method according to claim 1, wherein the thickness of the photosensitive insulating layer is in a range of 3–5 μm.

8. The method according to claim 1, wherein the exposure to the photosensitive insulating layer during the photolithography process is in a range of 30–80 mJ/cm$^2$.

9. The method according to claim 1, wherein developing the photosensitive insulating layer and etching the non-photosensitive insulating layer is proceeded.

10. The method according to claim 9, wherein the developer solution is TMAH 2.38%.

11. The method according to claim 9, wherein the duration time for developing the photosensitive insulating layer and etching the non-photosensitive insulating layer is in a range of 50–100 seconds.

12. The method according to claim 1, wherein the photosensitive insulating layer is developed into a reversed trapezoid shape.

13. The method according to claim 12, wherein a long base of the reversed trapezoid shape of the photosensitive insulating layer is longer than or equal to a bottom edge of the shape of the etched non-photosensitive insulating layer.

14. The method according to claim 1, wherein the non-photosensitive insulating layer is etched into a trapezoid shape.

15. The method according to claim 14, wherein a top edge of the shape of the developed photosensitive insulating layer is longer than or equal to a long base of the trapezoid shape of the non-photosensitive insulating layer.

16. The method according to claim 1, wherein developing the photosensitive insulating layer and etching the non-photosensitive insulating layer further comprises performing a curing process.

17. The method according to claim 16, wherein the temperature of the curing process is in a range of 200–350 Celsius degrees.

18. The method according to claim 16, wherein the duration time of the curing process is in a range of 30–120 minutes.

19. A method for manufacturing an organic electroluminescent display, comprising:
    forming a substantially transparent substrate;
    forming a plurality of first display electrodes arranged in parallel on said substrate;
    forming a non-photosensitive insulating layer over said substrate;
    applying a baking process to said non-photosensitive insulating layer;
    forming a photosensitive insulating layer on said non-photosensitive insulating layer, and pre-baking said photosensitive insulating layer;
    performing a photolithography process on said photosensitive insulating layer so as to define a shape having a longitudinal axis perpendicular to a longitudinal axis of the first display electrodes, and performing a post-exposure baking process on said photosensitive insulating layer;
    dipping an aggregate composed of said substrate with said first display electrodes, said non-photosensitive insulating layer and said photosensitive insulating layer disposed thereon into a developer solution, whereby said photosensitive insulating layer is partially removed through development and said non-photosensitive insulating layer is partially removed by etching, and thereby said first display electrodes are exposed partially;
    curing said aggregate;
    forming an organic electroluminescent material on the exposed first display electrodes; and
    forming a plurality of second display electrodes on the organic electroluminescent material.

20. The method according to claim 19, wherein the non-photosensitive insulating layer is made of a thermal type polyimide.

21. The method according to claim 19, wherein the temperature of baking said non-photosensitive insulating layer is in a range of 50–120 Celsius degrees.

22. The method according to claim 19, wherein the temperature of post-exposure baking said photosensitive insulating layer is in a range of 90–150 Celsius degrees.

23. The method according to claim 19, wherein the duration time of post-exposure baking said photosensitive insulating layer is in a range of 30–120 seconds.

24. The method according to claim 19, wherein the photosensitive insulating layer is developed into a reversed trapezoid shape.

25. The method according to claim 24, wherein a long base of the reversed trapezoid shape of the photosensitive insulating layer is longer than or equal to a bottom edge of the shape of the etched non-photosensitive insulating layer.

26. The method according to claim 19, wherein the non-photosensitive insulating layer is etched into a trapezoid shape.

27. The method according to claim 26, wherein a top edge of the shape of the developed photosensitive insulating layer is longer than or equal to a long base of the trapezoid shape of the non-photosensitive insulating layer.

28. A method for manufacturing an organic electroluminescent display, comprising:
    forming a substantially transparent substrate;
    forming a plurality of first display electrodes arranged in parallel on said substrate;
    forming a first photosensitive insulating layer over said substrate;
    forming a second photosensitive insulating layer on said first photosensitive insulating layer;
    performing a photolithography process on said first and second photosensitive insulating layers;
    developing said first and second photosensitive insulating layers simultaneously so as to form a pattern of first and second photosensitive insulating layers having a shape with a longitudinal axis substantially perpendicular to a longitudinal axis of the first display electrodes, and the first display electrodes being exposed partly;
    forming an organic electroluminescent material on the exposed first display electrodes; and
    forming a plurality of second display electrodes on the organic electroluminescent material,
    wherein the photosensitivity of the first photosensitive insulating layer is different from that of the second photosensitive insulating layer.

29. The method according to claim 28, wherein developing said first and second photosensitive insulating layers is proceeded through a developer solution.

30. The method according to claim 28, wherein the photosensitivity of said first photosensitive insulating layer is greater than that of said second photosensitive insulating layer.

31. A method for manufacturing an organic electroluminescent display, comprising:
    forming a substantially transparent substrate;
    forming a plurality of first display electrodes arranged in parallel on said substrate;
    forming a first photosensitive insulating layer over said substrate;
    forming a second photosensitive insulating layer on said first photosensitive insulating layer;
    performing a photolithography process on said first and second photosensitive insulating layers so as to define a shape having a longitudinal axis perpendicular to a longitudinal axis of the first display electrodes;

dipping an aggregate composed of said substrate with said first display electrodes, said first photosensitive insulating layer and said second photosensitive insulating layer disposed thereon into a developer solution, whereby said first and second photosensitive insulating layers are partially removed through development and thereby said first display electrodes are exposed partially;

forming an organic electroluminescent material on the exposed first display electrodes; and forming a plurality of second display electrodes on the organic electroluminescent material.

32. The method according to claim 31, wherein the photosensitivity of said first photosensitive insulating layer is greater than that of said second photosensitive insulating layer.

* * * * *

UNITED STATES PATENT AND TRADEMARK OFFICE
CERTIFICATE OF CORRECTION

PATENT NO. : 6,977,136 B2
APPLICATION NO. : 09/730904
DATED : December 20, 2005
INVENTOR(S) : Chia-Tin Chung et al.

It is certified that error appears in the above-identified patent and that said Letters Patent is hereby corrected as shown below:

On the Title page, the following should be inserted in the left column on the line immediately after the Assignee "Chi Mei Optoelectronics Corporation:"

-- Kyocera Corporation, (JP) --

Column 6, Line 67 Insert -- through a developer solution -- following the word "proceeded".

Signed and Sealed this

Fifteenth Day of May, 2007

JON W. DUDAS
*Director of the United States Patent and Trademark Office*